(12) United States Patent
Nishi et al.

(10) Patent No.: US 9,214,587 B2
(45) Date of Patent: Dec. 15, 2015

(54) PHOTOELECTRIC CONVERSION MODULE AND MANUFACTURING METHOD THEREOF

(75) Inventors: Kazuo Nishi, Kanagawa (JP); Yasushi Maeda, Kanagawa (JP); Ryosuke Motoyoshi, Kanagawa (JP); Yuji Oda, Kanagawa (JP); Kei Takahashi, Kanagawa (JP); Yoshiaki Ito, Tokyo (JP); Tatsuji Nishijima, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 890 days.

(21) Appl. No.: 13/212,395

(22) Filed: Aug. 18, 2011

(65) Prior Publication Data

US 2012/0042926 A1    Feb. 23, 2012

(30) Foreign Application Priority Data

Aug. 19, 2010   (JP) ................................ 2010-184147

(51) Int. Cl.
| | |
|---|---|
| H01L 31/0224 | (2006.01) |
| H01L 31/075 | (2012.01) |
| H01L 31/02 | (2006.01) |
| H01L 31/05 | (2014.01) |
| H01L 31/046 | (2014.01) |

(52) U.S. Cl.
CPC ........ *H01L 31/075* (2013.01); *H01L 31/02008* (2013.01); *H01L 31/046* (2014.12); *H01L 31/0504* (2013.01); *Y02E 10/548* (2013.01)

(58) Field of Classification Search
CPC ............................................... H01L 31/02021
USPC .................................................. 136/244–265
See application file for complete search history.

(56) References Cited

U.S. PATENT DOCUMENTS

| | | | |
|---|---|---|---|
| 4,725,558 A | 2/1988 | Yamazaki et al. | |
| 4,786,607 A | 11/1988 | Yamazaki et al. | |
| 4,812,415 A | 3/1989 | Yamazaki et al. | |
| 4,937,651 A | 6/1990 | Yamazaki et al. | |
| 5,089,426 A | 2/1992 | Yamazaki et al. | |
| 5,458,695 A | 10/1995 | Arai et al. | |
| 6,182,403 B1 | 2/2001 | Mimura et al. | |
| 8,835,748 B2 * | 9/2014 | Frolov et al. ................. | 136/249 |
| 2007/0102037 A1 * | 5/2007 | Irwin ............................. | 136/246 |
| 2010/0126550 A1 * | 5/2010 | Foss .............................. | 136/244 |
| 2011/0005571 A1 * | 1/2011 | Yamamuro et al. ........... | 136/244 |
| 2011/0162684 A1 * | 7/2011 | Kim et al. ..................... | 136/244 |
| 2011/0265845 A1 | 11/2011 | Nasuno et al. | |

FOREIGN PATENT DOCUMENTS

| | | | |
|---|---|---|---|
| EP | 0 828 035 A2 | 3/1998 | |
| EP | 2 378 562 A1 | 10/2011 | |

(Continued)

*Primary Examiner* — Jayne Mershon
(74) *Attorney, Agent, or Firm* — Husch Blackwell LLP

(57) ABSTRACT

A photoelectric conversion module in which an output voltage defect is suppressed is obtained by forming in parallel over a substrate n number (n is a natural number) of integrated photoelectric conversion devices each including a plurality of cells that are connected in series, and electrically connecting in parallel n–1 number or less of integrated photoelectric conversion devices with normal electrical characteristics and excluding an integrated photoelectric conversion device with a characteristic defect such as a short-circuit between top and bottom electrodes or a leak current due to a structural defect or the like formed in a semiconductor layer or the like.

18 Claims, 9 Drawing Sheets

(56) References Cited

FOREIGN PATENT DOCUMENTS

| JP | 59-003981 A | 1/1984 |
|---|---|---|
| JP | 62-69566 | 3/1987 |
| JP | 6-224456 | 8/1994 |
| JP | 07-177652 A | 7/1995 |
| JP | 2004-197560 A | 7/2004 |
| JP | 2010-080549 A | 4/2010 |
| WO | WO 2010/079770 A1 | 7/2010 |

* cited by examiner

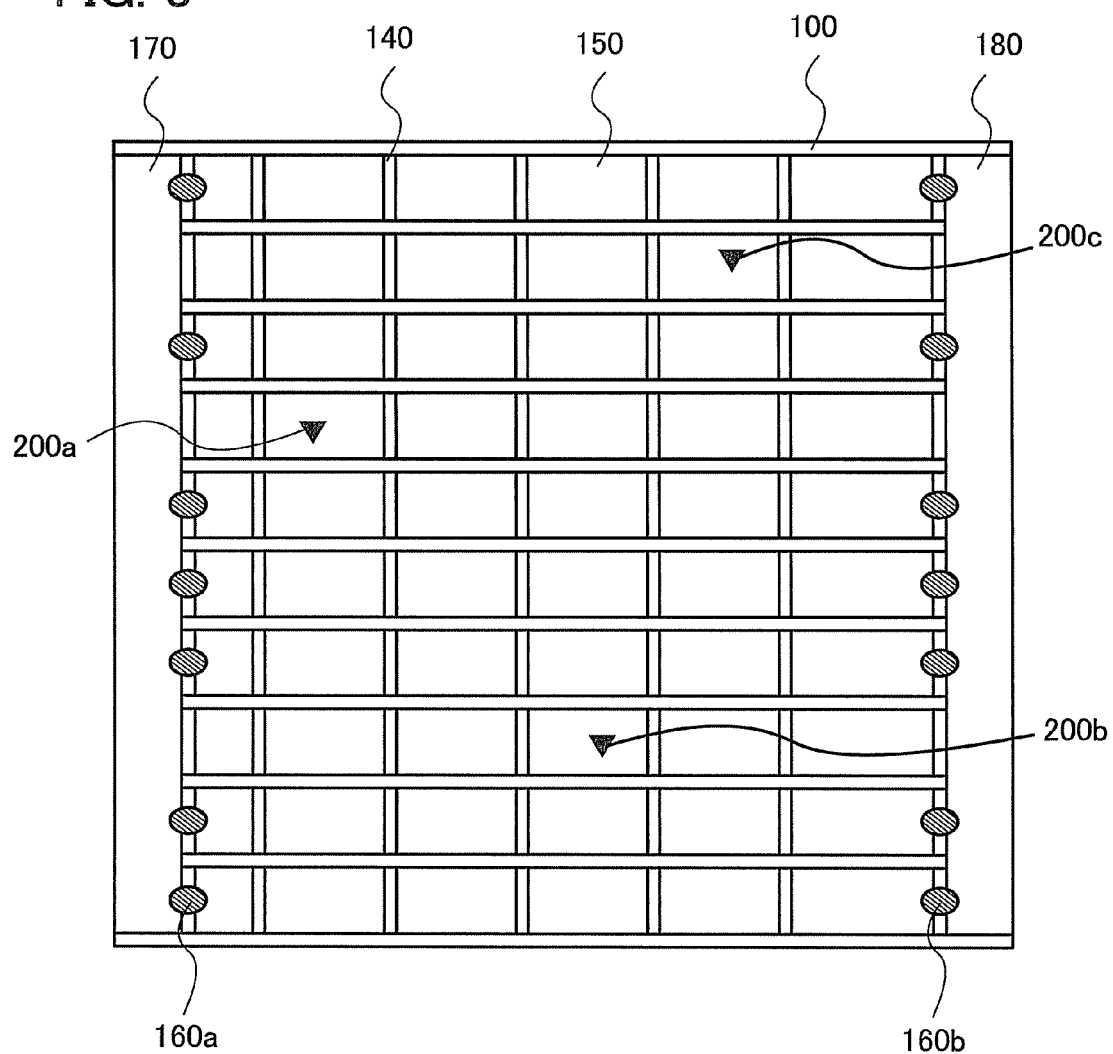

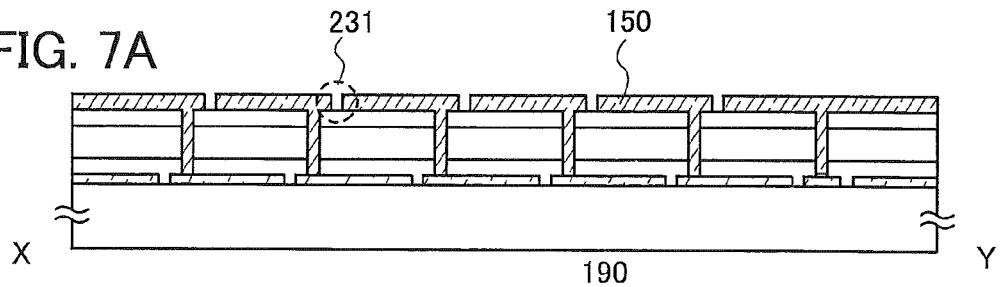
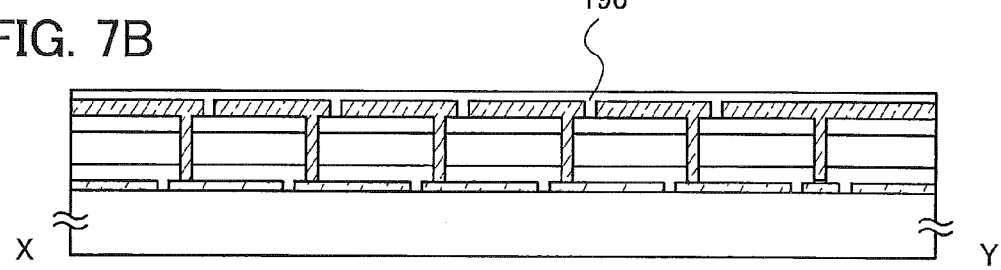
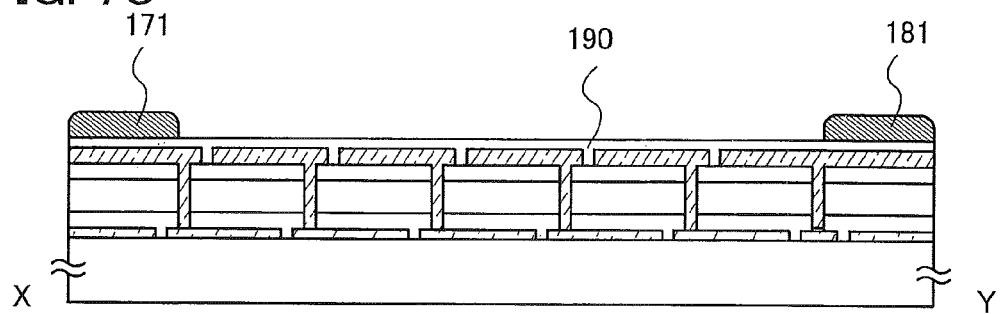
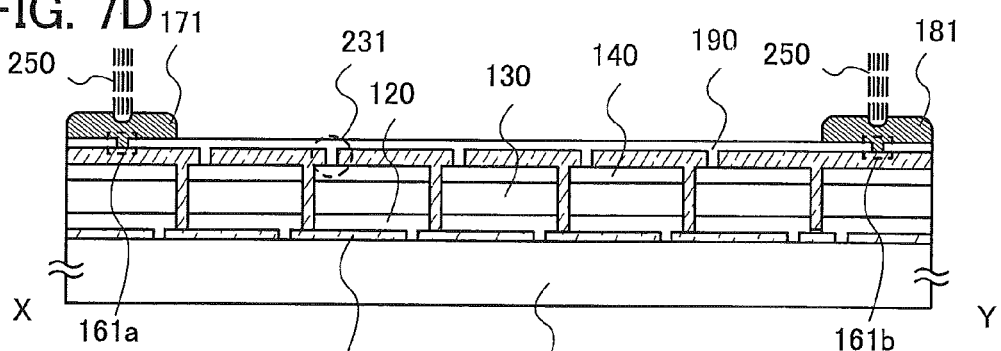
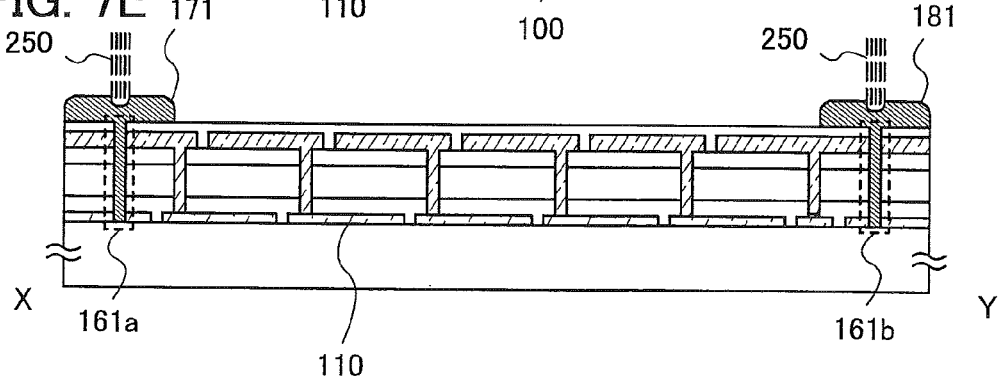

PHOTOELECTRIC CONVERSION MODULE AND MANUFACTURING METHOD THEREOF

BACKGROUND OF THE INVENTION

1. Field of the Invention

The present invention relates to a photoelectric conversion module with redundancy, and a manufacturing method thereof.

2. Description of the Related Art

In recent years, a photoelectric conversion device that generates power without carbon dioxide emissions has attracted attention as a countermeasure for global warming. A typical example is a solar battery using crystalline silicon that generates power with solar light from outside by being set on a roof or the like of a residential house, as well as a solar battery using amorphous silicon that has a high photoelectric conversion ability with respect to wavelength of visible light ray, such as light of a fluorescent lamp.

Amorphous silicon solar batteries are thin-film solar batteries, and have an advantage that they can be manufactured at a low cost. However, thin-film solar batteries are structurally weak against tiny defects, and electrical characteristics can be degraded due to structural defects such as pinholes and scratches.

The structural defects cause short-circuits and leak currents by their own effects or by affecting another process and reducing parallel resistance between electrodes of a solar battery. Even if a leak current is very small, under low illuminance that generates little electrical current, electrical characteristic of the solar cell becomes extremely degraded.

As a means for solving such problems, Patent Document 1 discloses a method of preventing a short circuit between top and bottom electrodes by applying a photo-resist over a semiconductor layer that has a structural defect and prebaking it to fix the photo-resist on the structural defect, and then unfixing unnecessary photo-resist that is over the semiconductor layer by ultraviolet light irradiation and removing it by a development process.

Also, Patent Document 2 discloses a method of preventing a short-circuit between one electrode and another electrode through a structural defect, by performing connection of a semiconductor layer and one of the electrodes in a plurality of open portions of an insulating layer that is formed over the semiconductor layer.

REFERENCE

Patent Document

[Patent Document 1] Japanese Published Patent Application No. S62-69566
[Patent Document 2] Japanese Published Patent Application No. H06-224456

SUMMARY OF THE INVENTION

However, there is a wide variety of structural defects that are undesirably formed in the semiconductor layer, and not all are solved by the above methods.

Note that in this specification, a "structural defect" refers to a defect where a portion of a film is missing, and does not refer to a crystal defect where a crystal structure is disturbed or the like.

For example, depending on a shape of the structural defect, insufficient filling of a photo-resist, insufficient coverage of an insulating film, or the like occurs, and there are cases where a short-circuit between top and bottom electrodes are not completely prevented. Also, a case where a structural defect such as a scratch occurs after all layers including an electrode are formed, a case where a short-circuit occurs between top and bottom electrodes due to pressing force or the like from a foreign object, or the like, cannot be dealt with by the above methods. Furthermore, in an integrated photoelectric conversion device in which a plurality of cells are connected in series, there is a problem that an output voltage is reduced if there is even one cell that is short-circuited.

Accordingly, an object of one mode of the present invention is to provide a photoelectric conversion module in which a cell with an abnormal electrical characteristic can be eliminated, and a manufacturing method thereof.

One mode of the present invention disclosed in this specification is a photoelectric conversion module comprising n number (n is a natural number) of photoelectric conversion devices that are formed in parallel over a substrate, wherein each of the photoelectric conversion devices has an integrated structure in which a plurality of cells are connected in series, and n−1 number or less of the photoelectric conversion devices are electrically connected in parallel.

A short-circuited photoelectric conversion device is not included in the above-mentioned photoelectric conversion devices that are connected in parallel, and photoelectric conversion devices with electrical characteristics that satisfy a design specification are selected. At this time, even if all of the photoelectric conversion devices satisfy the design specification, the number of photoelectric conversion devices that are electrically connected in parallel is n−1 or less, which is a redundancy design.

Also, a photoelectric conversion device that is not electrically connected in parallel even with favorable electrical characteristics can be used as a spare. For example, in the case that a portion of the photoelectric conversion devices that are connected in parallel becomes defective, it can be switched with a portion of the photoelectric conversion devices that are not connected in parallel, and then operated.

The above-mentioned cells are pin-types, and are preferably formed to contain amorphous silicon.

Electrical parallel connection of the photoelectric conversion devices may be configured to be performed in a switching circuit.

Another mode of the present invention disclosed in this specification is a manufacturing method of a photoelectric conversion module comprising the steps of forming a first conductive film over a substrate; forming a first separation groove in the first conductive film and forming a plurality of first electrodes; laminating a semiconductor layer with one conductivity type, an intrinsic semiconductor layer, and a semiconductor layer with a conductivity type opposite the one conductivity type over the first electrodes and the first separation groove; forming a second separation groove in the laminated semiconductor layers and forming a plurality of island-shaped semiconductor layers; forming a second conductive film so as to cover the island-shaped semiconductor layers and the second separation groove; forming a third separation groove in the second conductive film, forming a plurality of second electrodes and a pair of electrodes of a photoelectric conversion module, and forming in parallel n number (n is a natural number) of photoelectric conversion devices with an integrated structure containing the first electrodes, the island-shaped semiconductor layers, and the second electrodes; selecting n−1 number or less of the photoelectric conversion devices from the n number of photoelectric conversion devices formed in parallel; electrically connecting the first electrodes of the selected photoelectric conversion devices to one of the electrodes of the photoelectric conversion module; and electrically connecting the second electrodes of the selected photoelectric conversion devices to the other of the electrodes of the photoelectric conversion module.

Note that in this specification, numerals such as "first," "second," and the like are given to terms for convenience in distinguishing between elements, and do not limit the number thereof nor limit the arrangement or order of the steps.

A switching circuit for electrically connecting the first electrodes of the photoelectric conversion devices and one of the electrodes of the photoelectric conversion module, and/or electrically connecting the second electrodes of the photoelectric conversion devices and the other of the electrodes of the photoelectric conversion module may be formed.

By one mode of the present invention, a photoelectric conversion module in which an output voltage defect is suppressed, and a manufacturing method thereof can be provided.

BRIEF DESCRIPTION OF THE DRAWINGS

In the accompanying drawings:

FIG. 3 is a plan view illustrating a photoelectric conversion device according to one mode of the present invention;

FIGS. 7A to 7E are process cross-sectional views illustrating a manufacturing method of a photoelectric conversion device;

DETAILED DESCRIPTION OF THE INVENTION

Figure 1A:
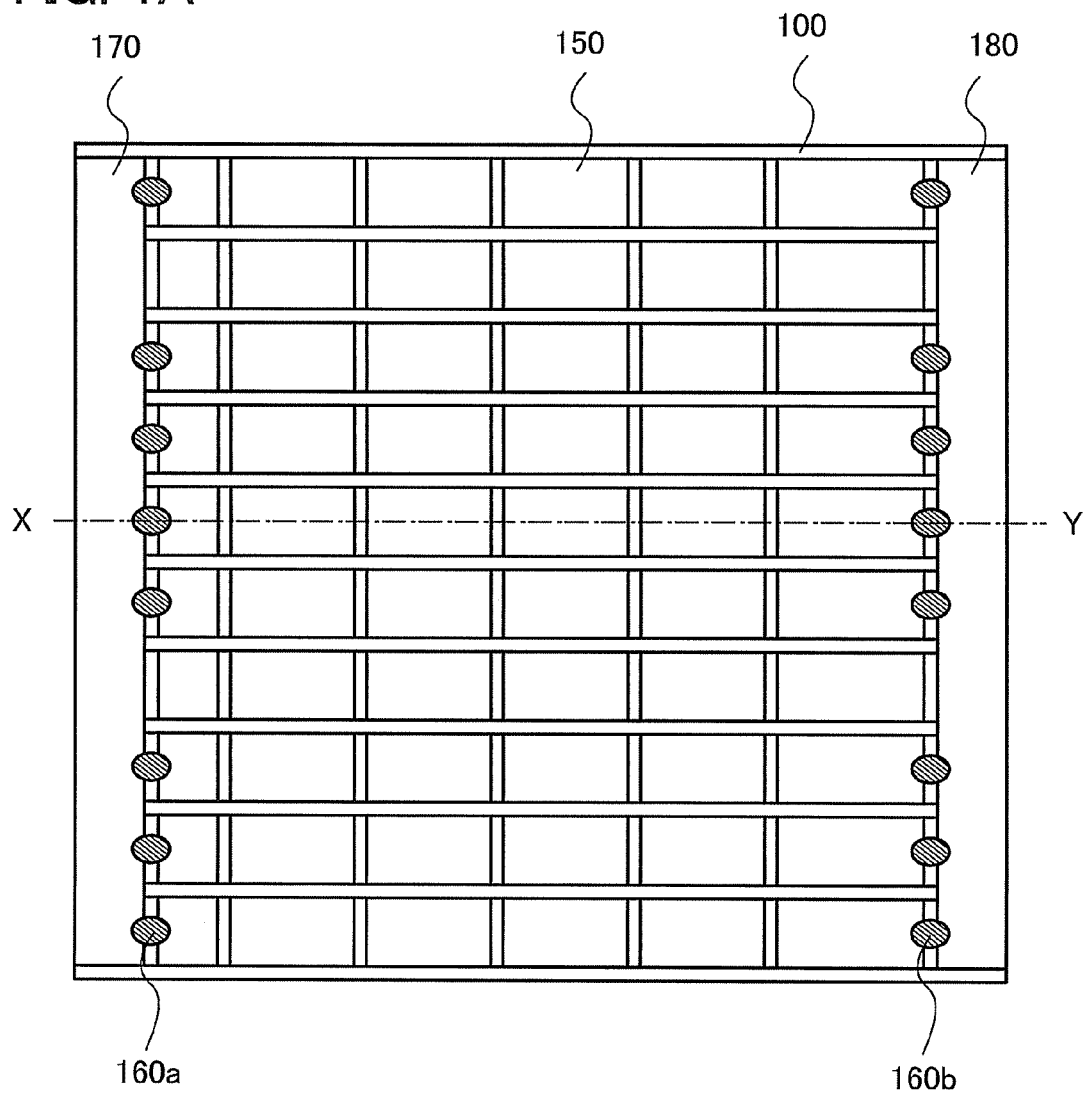
FIGS. 1A and 1B are a plan view and a cross-sectional view illustrating a photoelectric conversion device according to one mode of the present invention.

Hereinafter, embodiments of the present invention will be described in detail with reference to the accompanying drawings. However, the present invention is not limited to the description below and it is easily understood by those skilled in the art that the mode and details can be changed variously. Therefore, the present invention is not construed as being limited to description of the embodiments. Note that in all drawings used to illustrate the embodiments, portions that are identical or portion having similar functions are denoted by the same reference numerals, and their repetitive description may be omitted.

Embodiment 1

In this embodiment, a structure of a photoelectric conversion module according to one mode of the present invention and a manufacturing method thereof will be described.

Note that in a description of a photoelectric conversion module in one mode of the present invention, a "cell" refers to one photoelectric conversion element that contributes to power generation, and has a structure that includes for example a semiconductor layer with a pin junction, and top and bottom electrodes. Also, a "photoelectric conversion device" refers to a structure in which a plurality of cells are electrically connected in series.

Figure 1B:
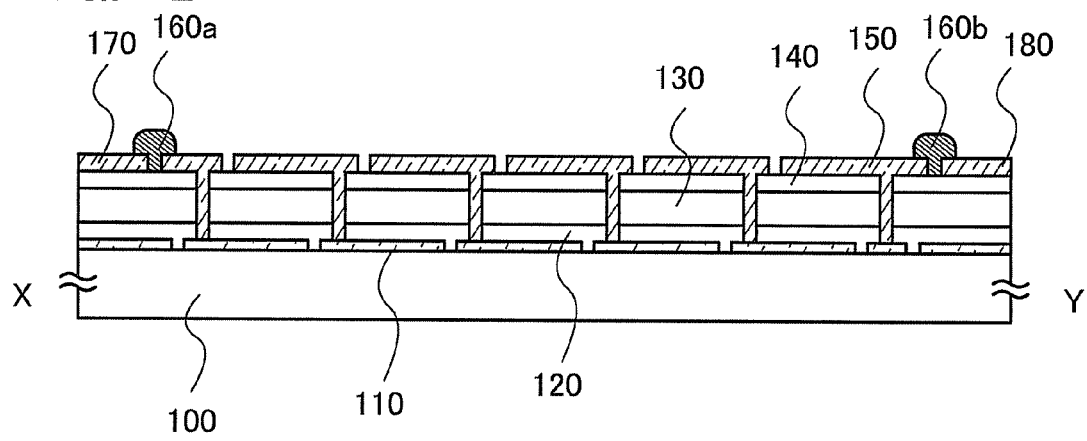

FIGS. 1A and 1B are examples of a plan view and a cross-sectional view, respectively, of a photoelectric conversion module according to one mode of the present invention. A photoelectric conversion module according to this embodiment includes a substrate 100, a first electrode 110, a first semiconductor layer 120, a second semiconductor layer 130, a third semiconductor layer 140, a second electrode 150, connection electrodes 160a and 160b, a third electrode 170, and a fourth electrode 180.

The third electrode 170 and the fourth electrode 180 are a pair of electrodes that are positive and negative electrodes of the photoelectric conversion module. For example, when a conductivity type of the first semiconductor layer 120 is p-type and a conductivity type of the third semiconductor layer 140 is n-type, the third electrode 170 becomes a positive electrode and the fourth electrode 180 becomes a negative electrode.

Also, the connection electrode 160a is provided to connect the third electrode 170 and the first electrode 110 of the photoelectric conversion device, and the connection electrode 160b is provided to connect the fourth electrode 180 and the second electrode 150 of the photoelectric conversion device.

Figure 2A:
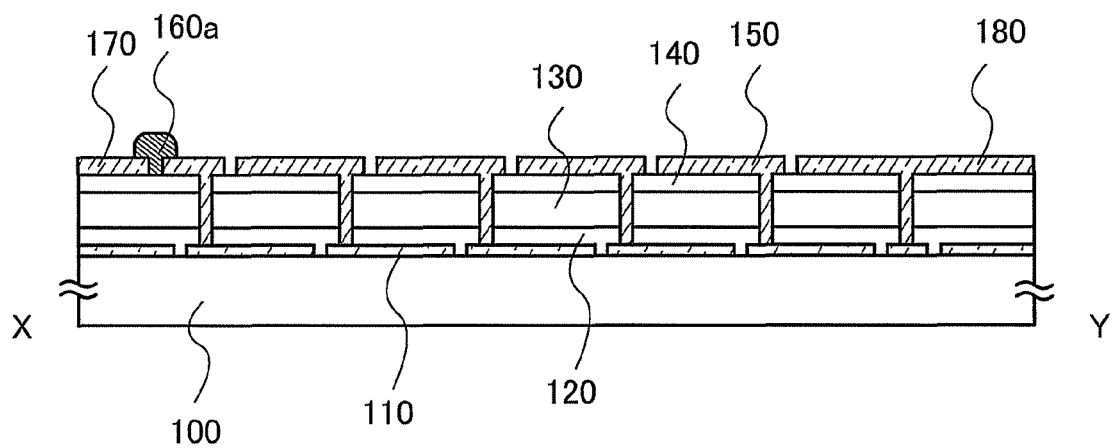
FIGS. 2A and 2B are cross-sectional views illustrating a photoelectric conversion device according to one mode of the present invention.
Figure 2B:
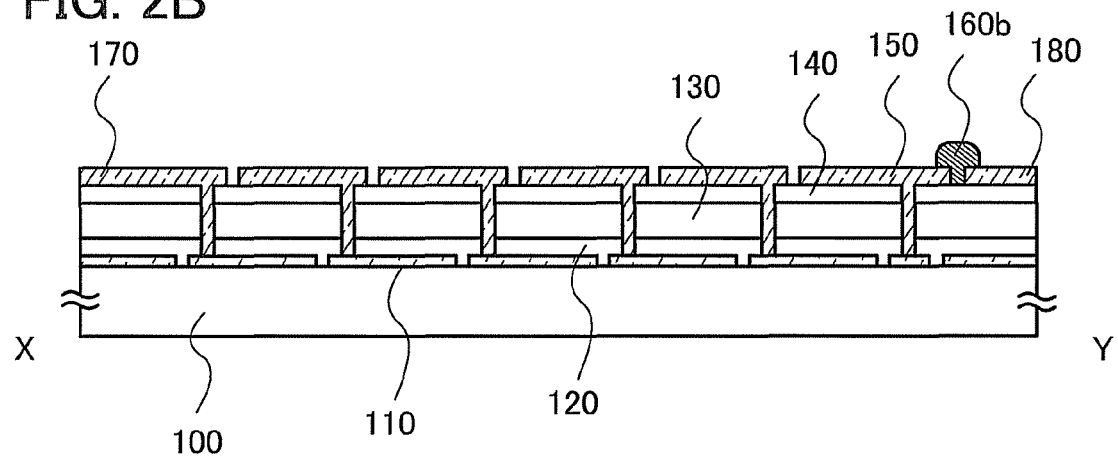

Note that as shown in the cross-sectional views of FIGS. 2A and 2B, the connection electrode 160a or the connection electrode 160b may be omitted. Here in FIG. 2A, although the fourth electrode 180 serves as an electrode of the photoelectric conversion module, it also serves as the second electrode 150 of a right edge.

Note that a plan view and a cross-sectional view of a photoelectric conversion module in this specification illustrate one example of a photoelectric conversion module, and the number of cells connected in series is not limited and may be appropriately determined by a practitioner so that a desired voltage is obtained. A structure of one cell is equivalent to a structure of an adjacent cell; therefore, a reference numeral of the cell may be omitted in some cases.

Figure 8A:
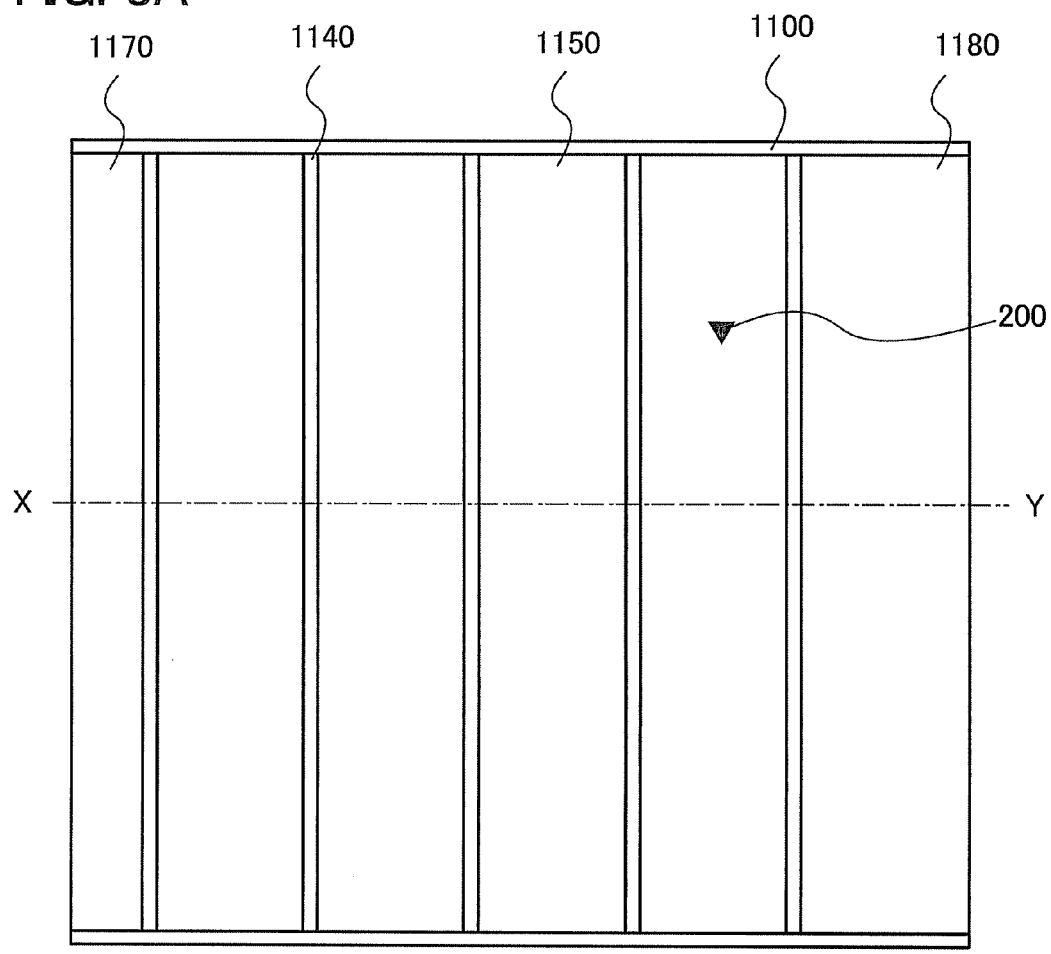
FIGS. 8A and 8B are a plan view and a cross-sectional view illustrating a conventional photoelectric conversion device.
Figure 8B:
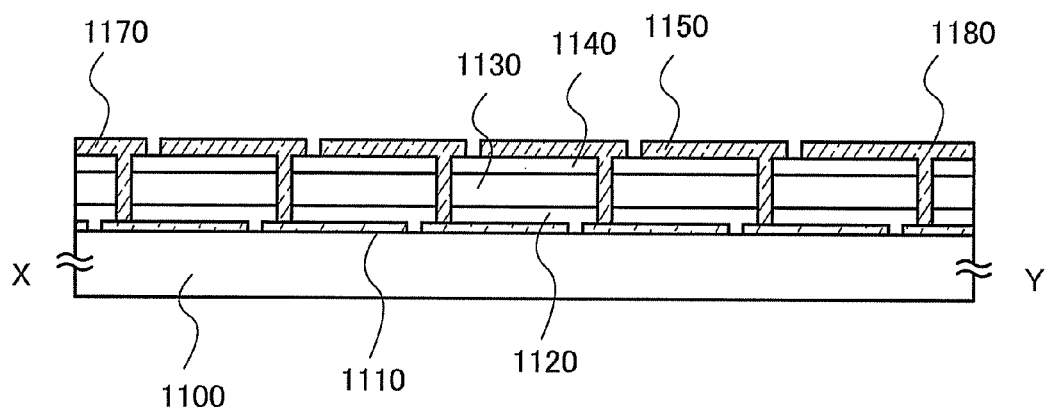

FIGS. 8A and 8B illustrate a plan view and a cross-sectional view of a conventional photoelectric conversion module structure. The photoelectric conversion module is a pin-type, and includes a substrate 1100, a first electrode 1110, a first semiconductor layer 1120, a second semiconductor layer 1130, a third semiconductor layer 1140, a second electrode 1150, a third electrode 1170, and a fourth electrode 1180. Here, although the fourth electrode 1180 serves as an electrode of the photoelectric conversion module, it also serves as the second electrode 1150 of a cell. Also, amorphous silicon is used to form a semiconductor layer included in the cell.

Since 5 cells are connected in series in this structure, if it is a normal product, about 0.7 V is obtained per one cell as an open voltage (Voc) under an interior lamp with low illuminance such as a fluorescent lamp, and about 3.5 V is obtained per 5 cells. Accordingly, by design, it can be used as a power source for an apparatus with a maximum driving voltage of about 3 V.

Here, as shown in the plan view of FIG. 8A, suppose that there is a structural defect 200 in one of the 5 cells connected in series, and there is a short-circuit between the first electrode 1110 and the second electrode 1150 in that portion. At this time, since the one cell is in a conductive state, the open voltage becomes about 2.8 V, and an apparatus with a driving voltage of 3V cannot be operated.

That is, in the structure of the conventional photoelectric conversion module, if there is even one portion with a defect by which a certain voltage or more cannot be output, the photoelectric conversion module is deemed a defective product.

Under low illuminance in particular, since a current that is output is small, even a small leak current between top and bottom electrodes becomes a problem. A cause of such short-circuits and leak currents is often a structural defect such as pin holes and scratches that are undesirably formed during formation of a semiconductor film. Accordingly, there has been devisal for preventing short-circuits and leak currents between top and bottom electrodes, such as embedding an insulator such as a resin or an inorganic film into the structural defect. However, not only do these methods have problems such as insufficient filling and coverage of the insulator, they cannot deal with structural defects that are formed due to pressing force or the like from a foreign object after formation of the cells.

Accordingly, one mode of the present invention provides a photoelectric conversion module with a redundancy design capable of outputting a designed voltage even when there is a structural defect in a plurality of cells included in a photoelectric conversion module that may degrade the electrical characteristic.

For example, as shown in the plan view of FIG. 3, when there are structural defects 200a, 200b, and 200c in photoelectric conversion devices in columns 1, 3, and 4 from the left, which can cause short-circuits between top and bottom electrodes, with the photoelectric conversion module with the conventional structure described previously, 3 cells out of 5 cells do not generate a predetermined voltage. However, as shown in FIG. 3, if the connection electrode 160a and/or the connection electrode 160b is/are not provided in photoelectric conversion devices with structural defects in rows 2, 4, and 8 from the top, and remaining photoelectric conversion devices with normal electrical characteristics are connected in parallel, a normal output voltage worth 5 cells can be obtained.

Note that "photoelectric conversion devices with normal electrical characteristics" not only include a photoelectric conversion device that does not have a fatal defect such as a short-circuit, but also include a photoelectric conversion device that does not have a factor that degrades the electrical characteristics of the entire photoelectric conversion module below design specification. Accordingly, even if there is a defect in the electrical characteristics of a photoelectric conversion device, if the degree of the defect is minor or if it still satisfies the design specification, it is deemed a photoelectric conversion device with normal electrical characteristics, and a discrimination criterion can be appropriately determined by the practitioner. In this specification, that which has normal electrical characteristics is also called a "good product," and that which is not a good product is called a "defective product."

However, since a current is not obtained from a photoelectric conversion device that is not connected, in the structure of the photoelectric conversion module of FIG. 3, only a current worth 7 rows (7 photoelectric conversion devices) out of 10 rows of photoelectric conversion devices (10 photoelectric conversion devices) that are formed, that is, only 70% of a maximum obtainable current can be obtained.

Here, if a current value of 70% is within an acceptable range of a design value, the photoelectric conversion module with the structure of FIG. 3 can be deemed a good product. Also, in the case that there is little structural defect and the current value exceeds an upper limit of a design specification when all photoelectric conversion devices that are good products are connected, a structure may be that of not providing the connection electrode 160a and/or connection electrode 160b in several of the photoelectric conversion devices to make the current value to be within the acceptable range of the design value. That is, by forming n number of photoelectric conversion devices over a substrate and having a redundancy design in which n-1 number or less of the photoelectric conversion devices are connected in parallel, yield of good products can be improved.

Also, in a photoelectric conversion module including photoelectric conversion devices that are good products which are not connected in parallel in an initial state as described above, in the case that one of the photoelectric conversion devices that are connected in parallel is a defective product, if the connection electrode 160a and the connection electrode 160b are not provided in the photoelectric conversion devices that are good products which are not connected in parallel, the photoelectric conversion module can function normally. That is, a photoelectric conversion module containing a spare photoelectric conversion device can be formed.

Also, in the case that a defect such as a short-circuit has occurred in a portion of the photoelectric conversion device that are connected in parallel due to change with passage of time or due to a sudden cause, the photoelectric conversion device is separated off and an output voltage can be secured. In this case, if there is no problem in an operation of a load that is connected to the photoelectric conversion module, the spare photoelectric conversion device does not need to be connected.

Figure 4A:
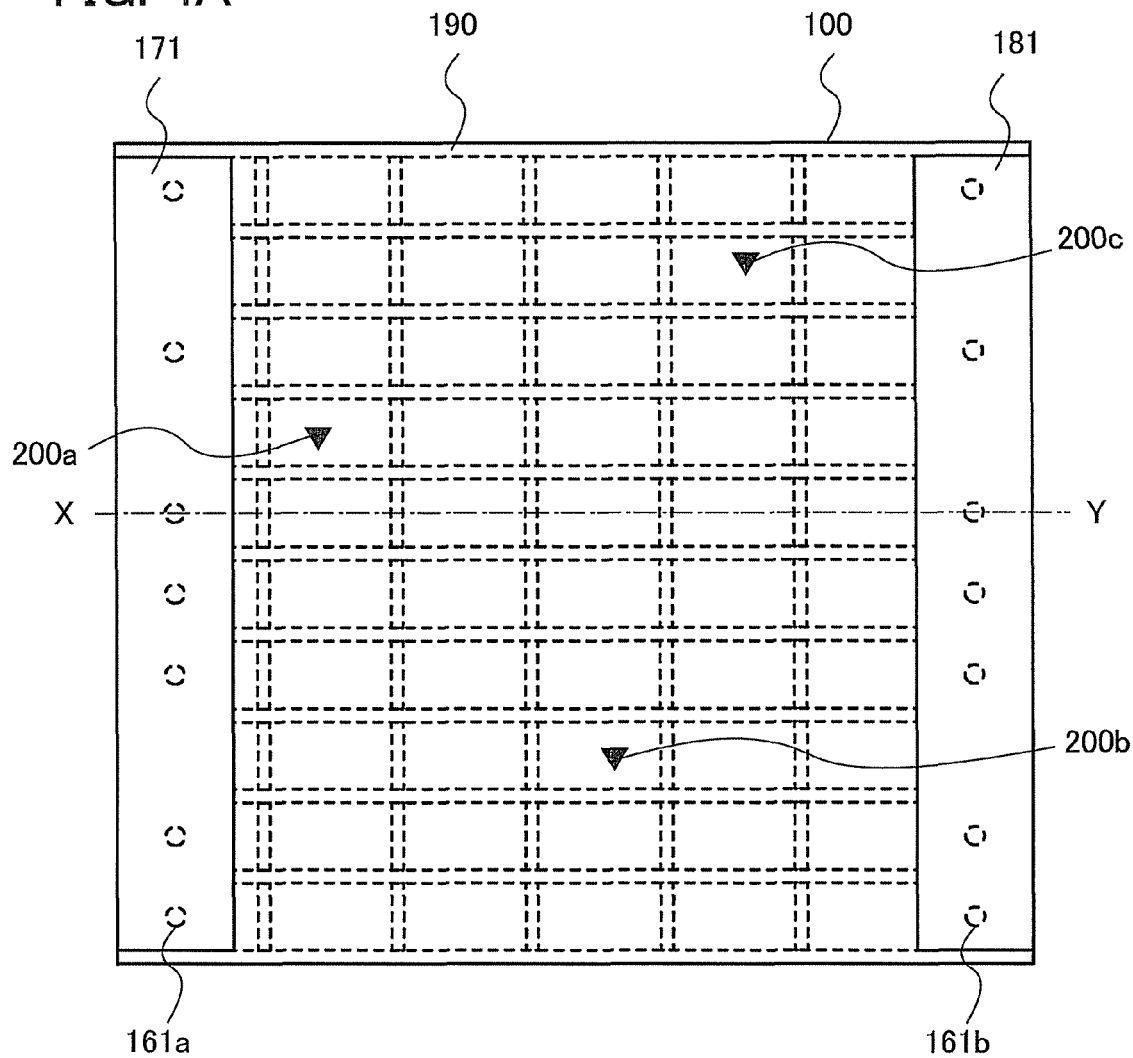
FIGS. 4A and 4B are a plan view and a cross-sectional view illustrating a photoelectric conversion device according to one mode of the present invention.
Figure 4B:
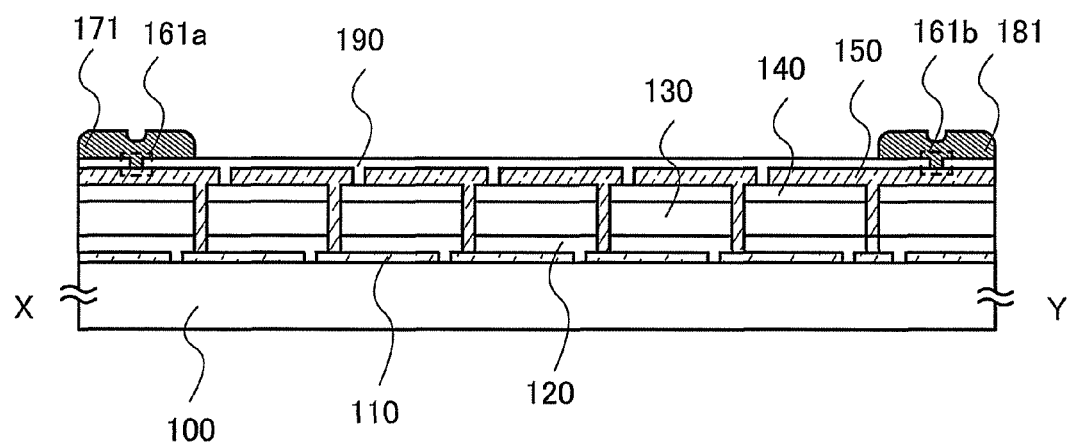

Next, FIGS. 4A and 4B illustrate a plan view and a cross-sectional view of a photoelectric conversion module with a different structure from that of the photoelectric conversion module described previously. The structures in FIGS. 1A and 1B, FIGS. 2A and 2B, and FIG. 3 have been structures in which an electrode of a photoelectric conversion device and an electrode of a photoelectric conversion module are electrically connected through a connection electrode. In the photoelectric conversion module illustrated in FIGS. 4A and 4B, an insulating layer 190 and an electrode of the photoelectric conversion module are formed over the photoelectric conversion device, and through connection grooves 161a and 161b that are formed in the insulating layer, an electrode of the photoelectric conversion device and the electrode of the photoelectric conversion module are connected.

That is, by forming the connection grooves 161a and 161b in the insulating layer 190 over the photoelectric conversion devices that need to be electrically connected in parallel, the photoelectric conversion module can be completed.

Also, as a means of synthesizing electrical power that is output from the photoelectric conversion devices that are good products, an external circuit may be used. In this case, a circuit that synthesizes electrical power of the photoelectric conversion devices which output a certain voltage or more can be used.

For the substrate 100 included in the photoelectric conversion module according to one mode of the present invention, a glass plate of general flat glass, clear flat glass, lead glass, crystallized glass, or the like can be used. Alternatively, a non-alkali glass substrate of aluminosilicate glass, barium borosilicate glass, aluminoborosilicate glass, or the like, or a quartz substrate can be used. In this embodiment, a glass substrate is used as the substrate 100, and a surface of the substrate 100 which is opposite to a surface over which a semiconductor layer or the like is formed is set as a light incidence side.

Alternative, a resin substrate can be used as the substrate 100. For example, the following can be given: polyether sulfone (PES); polyethylene terephthalate (PET); polyethylene naphthalate (PEN); polycarbonate (PC); a polyamide-based synthetic fiber; polyether etherketone (PEEK); polysulfone (PSF); polyether imide (PEI); polyarylate (PAR); polybutylene terephthalate (PBT); polyimide; an acrylonitrile butadiene styrene resin; poly vinyl chloride; polypropylene; poly vinyl acetate; an acrylic resin, and the like.

For the first electrode 110, a light-transmitting conductive film containing the following can be used: indium tin oxide (ITO); indium tin oxide containing silicon (ITSO); indium tin oxide containing zinc (IZO); zinc oxide (ZnO); zinc oxide containing gallium (GZO); zinc oxide containing aluminum (AZO); tin oxide ($SnO_2$); tin oxide containing fluorine (FTO); tin oxide containing antimony (ATO); or the like. The above light-transmitting conductive film is not limited to a single layer, and may be a lamination of different films. For example, a lamination of an ITO film and an AZO film, a lamination of an ITO film and an FTO film, or the like can be used. A total film thickness is to be 10 nm or more and 1000 nm or less. Also, although not shown in the figure, a surface of the first electrode 110 may have a textured structure so as to give a light-trapping effect.

Also, for the second electrode 150, a metal film of aluminum, titanium, nickel, silver, molybdenum, tantalum, tungsten, chromium, copper, stainless steel, or the like can be used. The metal film is not limited to a single layer, and may be a lamination of different films. For example, a lamination of a stainless steel film and an aluminum film, a lamination of a silver film and an aluminum film, or the like can be used. A total film thickness is to be 100 nm or more and 600 nm or less, preferably 100 nm or more and 300 nm or less.

Note that the second electrode 150 may be a lamination of the light-transmitting conductive film and a metal film. In this case, by having the light-transmitting conductive film on a side that is in contact with a semiconductor layer, a light-trapping effect can be given. Here, the film thickness of the light-transmitting conductive film is preferably 10 nm or more and 100 nm or less. For example, a lamination of ITO, silver, and aluminum formed in this order from the semiconductor layer side can be used.

The third electrode 170 and the fourth electrode 180 which are a pair of electrodes of the photoelectric conversion module can have the same structure as the second electrode 150.

Since light enters a cell through the substrate 100 in this embodiment, an ITO film which is a light-transmitting conductive film is used as the first electrode 110, and a lamination of a stainless steel film and an aluminum film is used as the second electrode 150. In the case that light enters from the second electrode side, materials used for the electrodes may be reversed. Note that although a light-transmitting conductive film is used for an electrode on the light incidence side, a type of an opposing electrode is not limited and can be appropriately selected by the practitioner.

For the first semiconductor layer 120, a semiconductor film with one conductivity type can be used, and for the third semiconductor layer 140, a semiconductor film with a conductivity type opposite the one conductivity type can be used. In this embodiment, although a p-type silicon semiconductor film is used for the first semiconductor layer 120, and an n-type silicon semiconductor film is used for the third semiconductor layer 140, conductivity types may be reversed. Note that the film thickness of the first semiconductor layer 120 is preferably 5 nm or more and 30 nm or less, and the film thickness of the third semiconductor layer 140 is preferably 10 nm or more and 30 nm or less. Furthermore, although amorphous silicon can be used for the first semiconductor layer 120 and the third semiconductor layer 140, it is preferable to use microcrystalline silicon or polycrystalline silicon which has lower resistance.

For the second semiconductor layer 130, an intrinsic semiconductor is used. Note that in this specification, an "intrinsic semiconductor" refers not only to a so-called intrinsic semiconductor in which the Fermi level lies in the middle of a band gap, but also to a semiconductor in which a concentration of an impurity imparting p-type or n-type conductivity is $1 \times 10^{20}$ $cm^{-3}$ or less, and in which photoconductivity is 100 times or more than a dark conductivity. This intrinsic semiconductor may include an element belonging to Group 13 or Group 15 of the periodic table as an impurity element. Note that the film thickness of the second semiconductor layer 130 is preferably 100 nm or more and 600 nm or less.

It is preferable to use amorphous silicon for the intrinsic semiconductor that is used for the second semiconductor layer 130. Amorphous silicon has a high light absorption of visible light; therefore, a photoelectric conversion device having a high photoelectric conversion ability in an environment with low illuminance such as under a fluorescent lamp can be formed.

As a material that can be used for the connection electrodes 160a and 160b, a conductive paste such as a silver paste is preferable. Alternatively, a copper paste, a nickel paste, a molybdenum paste, a carbon paste, or the like may be used.

For the insulating layer 190 in the structure of FIGS. 4A and 4B, other than an inorganic insulating film such as a silicon oxide film, an organic insulating resin such as an epoxy resin, a phenol resin, an acrylic resin, a silicone resin, or a polyimide resin can be used. Note that although not shown in the figure, in the structure of FIGS. 1A and 1B, FIGS. 2A and 2B, and FIG. 3, the insulating film may be provided over the photoelectric conversion devices.

Also, in the structure of FIGS. 4A and 4B, the third electrode 171 and the fourth electrode 181, which are a pair of electrodes of the photoelectric conversion module, can be formed using a conductive paste that can be used to form the above-mentioned connection electrodes 160a and 160b, other than using a metal film.

Next, a manufacturing method of a photoelectric conversion module with the structure illustrated in FIGS. 1A and 1B, FIGS. 2A and 2B, and FIG. 3 will be described in detail.

First, a light-transmitting conductive film serving as the first electrode 110 is formed over the substrate 100. Here, an indium tin oxide (ITO) film with a film thickness of 100 nm is formed using a sputtering method.

Although a glass substrate is used as the substrate 100 in this embodiment, if the above-mentioned resin substrate with a thickness of about 100 μm for example is used, roll-to-roll processing can be performed.

In roll-to-roll processing, in addition to a film formation step by a sputtering method, a plasma CVD method, or the like, a step by a screen printing method, a laser processing method, or the like is also included. Accordingly, almost the entire manufacturing process of a photoelectric conversion device can be performed by roll-to-roll processing. Furthermore, the process may partially be performed by roll-to-roll processing, and then divided into sheet forms to perform latter steps individually for each sheet. For example, by attaching each piece of the divided sheet to a frame that is formed of ceramic, metal, a composite body thereof, or the like, it can be handled in the same manner as a glass substrate or the like.

Figure 5A:
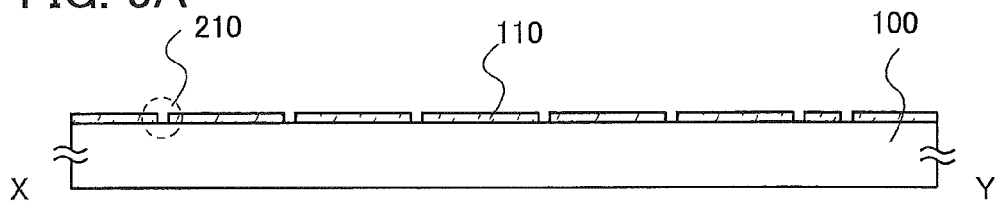
FIGS. 5A to 5E are process cross-sectional views illustrating a manufacturing method of a photoelectric conversion device.

Next, a first separation groove 210 which separates the light-transmitting conductive film into a plurality of pieces is formed (see FIG. 5A). The separation groove can be formed by laser processing or the like. As a laser used in this laser processing, a continuous wave laser or a pulsed laser which emits light in a visible light region or an infrared light region is preferably used. For example, a fundamental wave (wavelength: 1064 nm) or a second harmonic (wavelength: 532 nm) of an Nd-YAG laser can be used. Note that here, a portion of the separation groove may reach the substrate 100. Also, by the light-transmitting conductive film getting separated in this step, the first electrode 110 is formed.

Note that the first separation groove 210 is not only formed in a region shown in FIG. 5A, but also in a region between photoelectric conversion devices illustrated in the plan view of FIG. 1A, so that the plurality of photoelectric conversion devices that are formed in parallel do not become electrically connected.

Next, using a plasma CVD method, a p-type microcrystalline silicon film with a film thickness of 30 nm is formed as the first semiconductor layer 120. The p-type microcrystalline silicon film is formed by mixing a doping gas containing an impurity imparting p-type conductivity into a source gas. As the impurity imparting p-type conductivity, an element belonging to Group 13 of the periodic table such as boron or aluminum can typically be given. For example, a p-type microcrystalline silicon can be formed by mixing a doping gas such as diborane into a source gas such as silane. Note that although the first semiconductor layer 120 may be formed using amorphous silicon, it is preferably formed using microcrystalline silicon which has lower resistance as well as favorable adhesion to the first electrode 110.

Next, using a plasma CVD method, an i-type amorphous silicon film with a film thickness of 600 nm is formed as the second semiconductor layer 130. As a source gas, silane or disilane can be used, and hydrogen may be added thereto. At this time, an atmospheric component contained in the layer serves as a donor in some cases; therefore, boron (B) may be added to the source gas so that the conductivity type is closer to being i-type. In this case, the concentration of boron in the i-type amorphous silicon is made to be 0.001 at. % or higher and 0.1 at. % or lower.

Figure 5B:
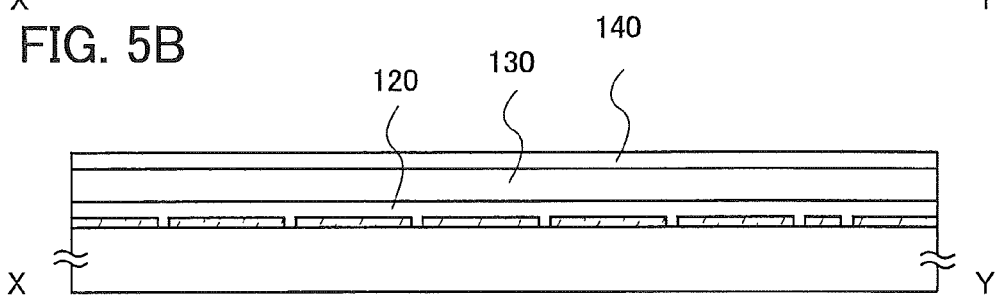

Furthermore, as the third semiconductor layer 140, an n-type microcrystalline silicon film with a film thickness of 30 nm is formed (see FIG. 5B). In this embodiment, a doping gas containing an impurity imparting n-type conductivity is mixed into a source gas, and an n-type microcrystalline silicon film is formed by a plasma CVD method. As the impurity imparting n-type conductivity, an element belonging to Group 15 of the periodic table such as phosphorus, arsenic, or antimony can typically be given. For example, an n-type microcrystalline silicon can be formed by mixing a doping gas such as phosphine into a source gas such as silane. Note that although the third semiconductor layer 140 may be formed using amorphous silicon, it is preferably formed using microcrystalline silicon which has lower resistance.

Figure 5C:
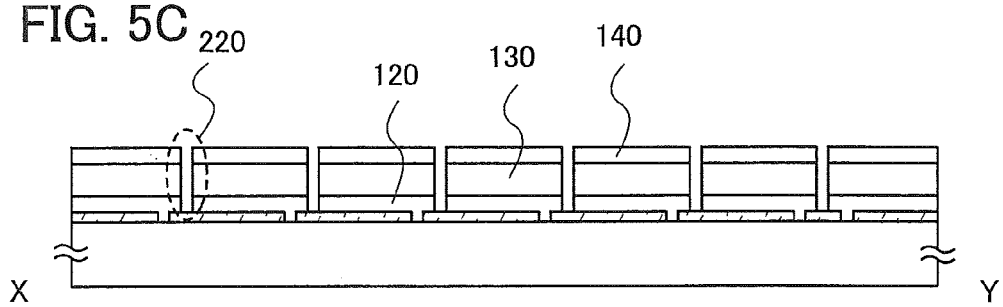

Next, a second separation groove 220 which separates the first semiconductor layer 120, the second semiconductor layer 130, and the third semiconductor layer 140 into a plurality of pieces is formed (see FIG. 5C). This separation groove can be formed by laser processing or the like. As a laser used in this laser processing, a continuous wave laser or a pulsed laser which emits light in a visible light region is preferably used. For example, a second harmonic (wavelength: 532 nm) or the like of an Nd-YAG laser can be used.

Note that the second separation groove 220 is not only formed in a region shown in FIG. 5C, but it may also be formed in the region between photoelectric conversion devices illustrated in the plan view of FIG. 1A in the same manner as the first separation groove 210. In this case, to prevent a short-circuit between the first electrode 110 and the second electrode 150, a width of the second separation groove 220 is made to be narrower than a width of the first separation groove 210 that is formed in this region, so that the first electrode is not exposed in the second separation groove 220. Also, the second separation groove 220 does not need to be provided in this region.

Next, a conductive film is formed in a manner that fills the second separation groove 220 and covers the third semiconductor layer 140. Here, a stainless steel film with a film thickness of 5 nm and an aluminum film with a film thickness of 300 nm are laminated in this order by a sputtering method.

Figure 5D:
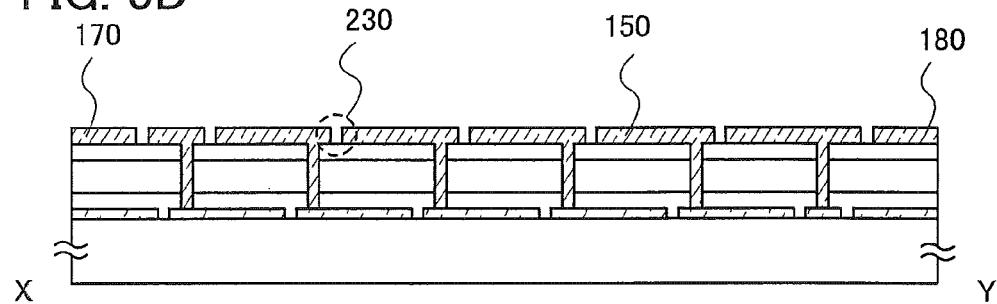

Then, a third separation groove 230 which separates the conductive film into a plurality of pieces is formed (see FIG. 5D). The separation groove can be formed by laser processing or the like. As a laser used in this laser processing, a continuous wave laser or a pulsed laser which emits light in an infrared light region is preferably used. For example, a fundamental wave (wavelength: 1064 nm) or the like of an Nd-YAG laser can be used. Furthermore, by the conductive film getting separated in this step, the second electrode 150, the third electrode 170, and the fourth electrode 180 are formed.

The third separation groove 230 is not only formed in a region shown in FIG. 5D, but also in the region between photoelectric conversion devices illustrated in the plan view of FIG. 1A in the same manner as the first separation groove 210. Note that instead of performing the previously-mentioned process in this region, the first electrode 110, the first semiconductor layer 120, the second semiconductor layer 130, the third semiconductor layer 140, and the second electrode 150 may be processed at the same time in this step, so that a plurality of photoelectric conversion devices that are formed in parallel do not become electrically connected.

Figure 6A:
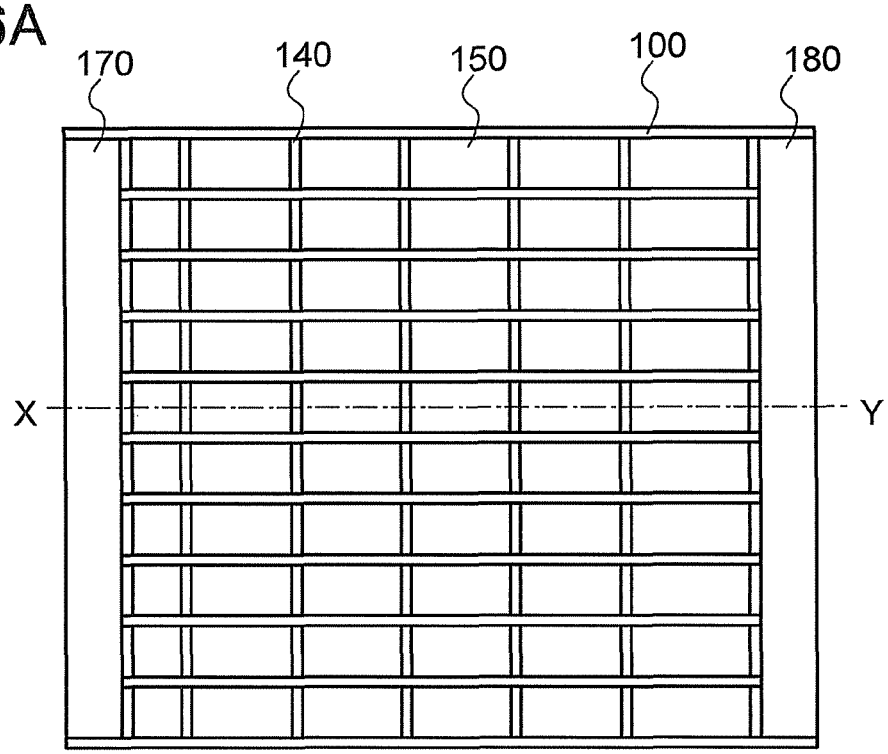
FIGS. 6A and 6B are process plan views illustrating a manufacturing method of a photoelectric conversion device.

A plan view of this step (a structure of FIG. 5D) is illustrated in FIG. 6A. FIG. 5D corresponds to a cross-sectional view along X-Y of FIG. 6A. Although FIG. 6A illustrates 10 rows of photoelectric conversion devices (10 photoelectric conversion devices) that are formed in parallel, the photoelectric conversion devices are not electrically connected to each other.

Here, electrical characteristics of all of the photoelectric conversion devices are obtained, the first electrode and the third electrode of the photoelectric conversion devices that are good products are electrically connected using the connection electrode 160a, and the second electrode and the fourth electrode of the photoelectric conversion devices are connected using the connection electrode 160b.

Figure 5E:
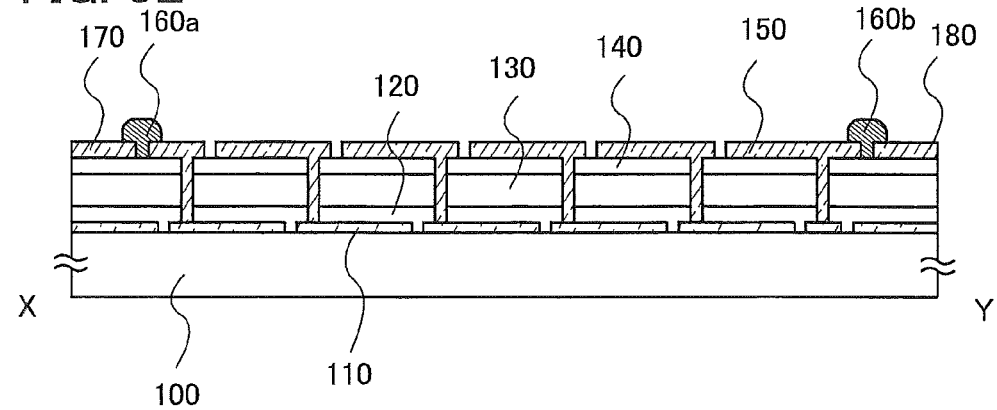
Figure 6B:
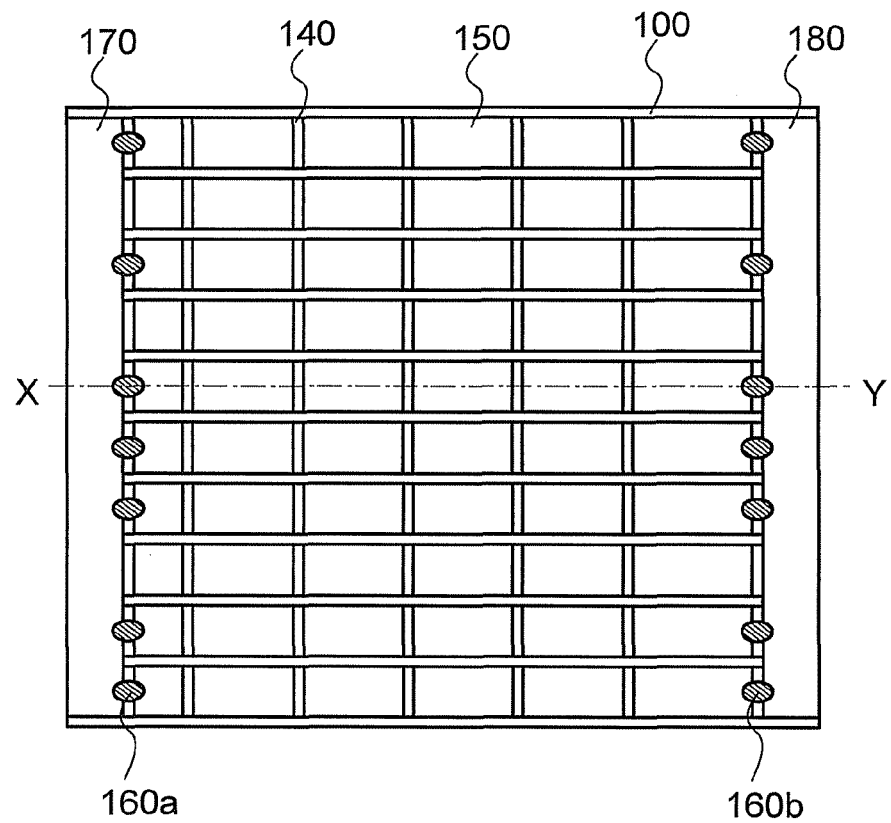

For example, in the case that the photoelectric conversion devices in rows 2, 4, and 8 from the top are defective products due to the structural defects 200a, 200b, and 200c as shown in FIG. 4A, only the rest of the photoelectric conversion devices that are good products are electrically connected in parallel using the connection electrodes 160a and 160b, the third electrode 170, and the fourth electrode 180 (see FIG. 5E and FIG. 6B).

In the structure of FIG. 6B, although the photoelectric conversion devices that are not connected in parallel have a structure in which both of the connection electrodes 160a and 160b are not provided, they may have a structure in which one of the connection electrodes 160a and 160b is provided.

However, in the case that a current value exceeds a current value of a design specification of the photoelectric conversion module if all of the photoelectric conversion devices that are good products are connected in parallel, a portion of the photoelectric conversion devices that are good products may be left unconnected to make the current value to be within the design specification.

In this manner, by having a photoelectric conversion module with a structure such as that shown in FIG. 6B, a cause of defect can be eliminated and a voltage according to design can be output.

Next, a manufacturing method of a photoelectric conversion module with the structure illustrated in FIGS. 4A and 4B will be described.

With respect to the structure of FIG. 5C, up through the step of forming the conductive film that serves as the second electrode 150 is the same as in the manufacturing method of a photoelectric conversion module with the structure of FIGS. 1A and 1B, FIGS. 2A and 2B, and FIG. 3, and the steps may be carried out according to the above-described manufacturing method.

Next, a separation groove 231 which separates the conductive film into a plurality of pieces is formed (see FIG. 7A). The separation groove can be formed by the same method as the formation method of the third separation groove 230 illustrated in FIG. 5D. By the conductive film getting separated in this step, the second electrode 150 is formed.

Note that the separation groove 231 is not only formed in a region shown in FIG. 7A, but also in a region between photoelectric conversion devices illustrated in the plan view of FIG. 4A. Note that instead of performing the process described in FIGS. 5A to 5C in this region, the first electrode 110, the first semiconductor layer 120, the second semiconductor layer 130, the third semiconductor layer 140, and the second electrode 150 may be processed at the same time in this step, so that the plurality of photoelectric conversion devices that are formed in parallel do not become electrically connected.

In this step, the electrical characteristics of all of the photoelectric conversion devices are obtained, and good products and defective products are determined according to design specification.

Next, an insulating layer 190 is formed in a manner that covers the photoelectric conversion devices. Here, a silicon oxide film with a film thickness of 300 nm is formed (see FIG. 7B).

Next, over the first electrode 110 and the second electrode 150 which are at both ends of the photoelectric conversion devices, the third electrode 171 and the fourth electrode 181 which are a pair of electrodes of the photoelectric conversion module are formed (see FIG. 7C). Here, the third electrode 171 and the fourth electrode 181 are formed by a screen printing method using a silver paste.

Next, in the photoelectric conversion devices which have been determined to be good products according to the electrical characteristics obtained in advance, the third electrode 171 and the fourth electrode 181 are irradiated with a laser light 250 from above (see FIG. 7D). By a thermal effect of this laser irradiation, the connection grooves 161a and 161b are formed in the insulating layer 190, and through the connection grooves, the first electrode 110 and the third electrode 171 are electrically connected, and the second electrode 150 and the fourth electrode 181 are electrically connected. Note that in this step, a laser that can be used to form the first separation groove 210 illustrated in FIG. 5A can be used.

Note that as shown in FIG. 7E, by adjusting the output of the laser light 250, the connection grooves 161a and 161b may be extended so as to have a structure in which each of the third electrode 171 and the fourth electrode 181 is connected to the first electrode 110 below it. The first electrode does not serve as an electrode of the photoelectric conversion device, and can reduce resistance of the third electrode 171 and the fourth electrode 181.

Accordingly, in the same manner as in the structure of FIGS. 1A and 1B, FIGS. 2A and 2B, and FIG. 3, it becomes possible to electrically connect in parallel only the photoelectric conversion devices that are good products. However, in the case that a current value exceeds a current value of a design specification of the photoelectric conversion module if all of the photoelectric conversion devices that are good products are connected in parallel, a portion of the photoelectric conversion devices that are good products may be left unconnected to make the current value to be within the design specification.

In this manner, by having a structure with redundancy in which only the photoelectric conversion devices exhibiting normal electrical characteristics can be electrically connected in parallel, product yield of the photoelectric conversion module can be improved.

This embodiment can be implemented in appropriate combination with the structure described in the other embodiments.

Embodiment 2

A photoelectric conversion module disclosed in this specification can be used in various electronic apparatuses. In this embodiment, an example of using the photoelectric conversion module as a power source for an electronic book will be described.

Figure 9A:
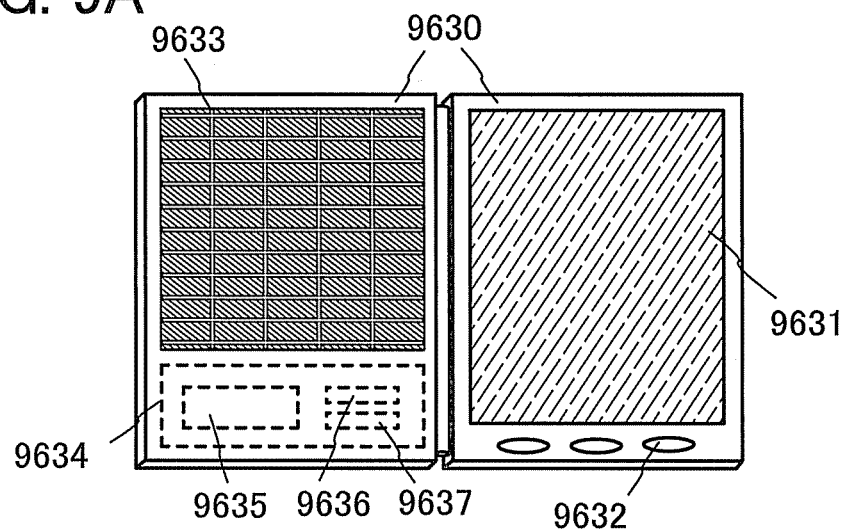
FIG. 9A is a diagram illustrating an electronic device and FIG. 9B is a block diagram illustrating a charge and discharge control circuit.

FIG. 9A shows an electronic book (also called an "E-book"), which can include a housing 9630, a display portion 9631, an operation key 9632, a photoelectric conversion module 9633, and a charge and discharge control circuit 9634. The electronic book shown in FIG. 9A can have a function of displaying various kinds of data (such as a still image, a moving image, or a text image), a function of displaying a calendar, the date, the time, or the like on the display portion, a function of operating or editing the data displayed on the display portion, a function of controlling processing by various kinds of software (programs), and the like. Note that in FIG. 9A, a structure including a battery 9635, a DCDC converter 9636, and a DCDC converter 9637 is illustrated as an example of the charge and discharge control circuit 9634. By using the photoelectric conversion module described in the other embodiment as the photoelectric conversion module 9633, power can be generated efficiently even under low illuminance; therefore, an electronic book which does not require a commercial power source even indoors can be manufactured.

By using a semi-transparent-type or reflective-type liquid crystal display device for the display portion 9631 of the electronic book illustrated in FIG. 9A, power consumption can be suppressed. Note that the photoelectric conversion module 9633 can be provided in not only the illustrated region but also in a space (a surface or a rear surface) of the housing 9630 as appropriate. When a lithium ion battery is used as the battery 9635, there is an advantage of size reduction or the like.

Figure 9B:
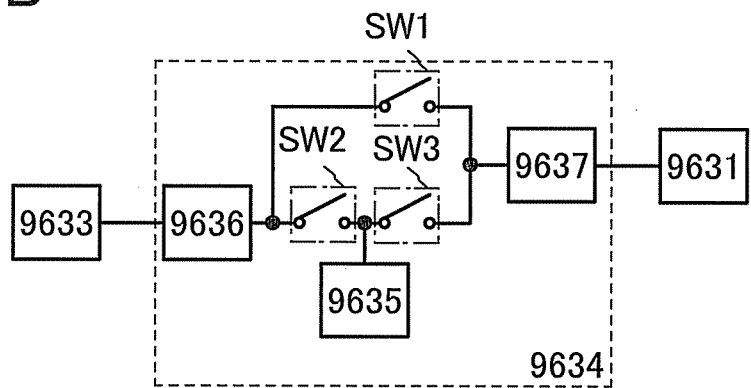

Furthermore, a structure and an operation of the charge and discharge control circuit 9634 illustrated in FIG. 9A will be described with reference to a block diagram in FIG. 9B. FIG. 9B shows the photoelectric conversion module 9633, the charge and discharge control circuit 9634, and the display portion 9631. Here, the charge and discharge control circuit 9634 includes the battery 9635, the DCDC converter 9636, the DCDC converter 9637, and switches SW1 to SW3.

First, an example of operation when power is generated by the photoelectric conversion module 9633 with external light will be described. The voltage of power generated by the photoelectric conversion module is raised or lowered by the DCDC converter 9636 to a suitable voltage for charging the battery 9635. Then, when performing a display in the display portion 9631, the switch SW1 is turned on, the voltage of the power is raised or lowered in the DCDC converter 9637 to a voltage that is needed in the display portion 9631, and power is supplied to the display portion 9631. On the other hand, when a display is not performed in the display portion 9631, the SW1 is turned off and the SW2 is turned on to charge the battery 9635.

Next, an example of operation when power is not generated by the photoelectric conversion module 9633 due to poor external light will be described. By tuning on the switch SW3, a voltage of power that is stored in the battery 9635 is raised or lowered by the DCDC converter 9637 to a voltage that is needed in the display portion 9631, and then supplied to the display portion 9631.

Note that in this embodiment, although two DCDC converters are provided between the photoelectric conversion module and the display portion, the DCDC converters therebetween may be omitted in a structure that allows for direct supplying of power to the display portion from the photoelectric conversion module, direct charging of the battery from the photoelectric conversion module, or direct supplying of power to the display portion from the battery.

Note that although an example of only using the photoelectric conversion module 9633 is described as one example of a power generation means, the battery 9635 may be charged by a combination of the photoelectric conversion module 9633 and a photoelectric conversion module with a different structure than the structure of the photoelectric conversion module 9633. Furthermore, the combination may be a combination of the photoelectric conversion module 9633 and another power generation means.

This embodiment can be implemented in appropriate combination with the structures described in the other embodiments.

This application is based on Japanese Patent Application serial no. 2010-184147 filed with Japan Patent Office on Aug. 19, 2010, the entire contents of which are hereby incorporated by reference.

What is claimed is:

1. A manufacturing method of a photoelectric conversion module, comprising the steps of:
   forming n number of photoelectric conversion devices with an integrated structure containing first electrodes, island-shaped semiconductor layers comprising an intrinsic semiconductor layer, and second electrodes over a substrate, wherein n is a natural number;
   obtaining electrical characteristics of the n number of photoelectric conversion devices;
   determining good products and defective products from the electrical characteristics of the n number of photoelectric conversion devices according to a design specification;
   selecting n−1 number or less of photoelectric conversion devices corresponding to the good products;
   forming an insulating film to cover the n number of photoelectric conversion devices;
   forming a pair of conductive layers over both ends of the n number of photoelectric conversion devices with the insulating film interposed therebetween; and
   irradiating the pair of conductive layers with a laser light, whereby a pair of electrodes of the photoelectric conversion module is formed and electrically connected to each of the first electrodes and the second electrodes of the selected photoelectric conversion devices in parallel.

2. The manufacturing method of the photoelectric conversion module according to claim 1, wherein the selected photoelectric conversion devices do not include a short-circuited photoelectric conversion device.

3. The manufacturing method of the photoelectric conversion module according to claim 1,
   wherein the photoelectric conversion module further comprises a photoelectric conversion device not connected to the selected photoelectric conversion devices,
   wherein the photoelectric conversion device has a substantially equivalent electrical characteristic of the selected photoelectric conversion devices, and
   wherein the photoelectric conversion device is used as a spare in the case that one of the selected photoelectric conversion devices becomes defective.

4. The manufacturing method of the photoelectric conversion module according to claim 1, wherein the intrinsic semiconductor layer is formed of amorphous silicon.

5. The manufacturing method of the photoelectric conversion module according claim 1, wherein each of the first electrodes comprises a light-transmitting conductive film.

6. The manufacturing method of the photoelectric conversion module according to claim 1, wherein the pair of electrodes of the photoelectric conversion module is in direct contact with the substrate through the first electrodes, the island-shaped semiconductor layers, and the second electrodes.

7. A manufacturing method of a photoelectric conversion module, comprising the steps of:
   forming n number of photoelectric conversion devices with an integrated structure containing first electrodes, island-shaped semiconductor layers comprising an intrinsic semiconductor layer, and second electrodes over a substrate, wherein n is a natural number;
   obtaining electrical characteristics of the n number of photoelectric conversion devices;
   determining good products and defective products from the electrical characteristics of the n number of photoelectric conversion devices according to a design specification;
   selecting n−1 number or less of photoelectric conversion devices corresponding to the good products;
   forming an insulating film to cover the n number of photoelectric conversion devices;
   forming a pair of conductive layers by a screen printing method over both ends of the n number of photoelectric conversion devices with the insulating film interposed therebetween; and
   irradiating the pair of conductive layers with a laser light, whereby a pair of electrodes of the photoelectric conversion module is formed and electrically connected to each of the first electrodes and the second electrodes of the selected photoelectric conversion devices in parallel.

8. The manufacturing method of the photoelectric conversion module according to claim 7, wherein the selected photoelectric conversion devices do not include a short-circuited photoelectric conversion device.

9. The manufacturing method of the photoelectric conversion module according to claim 7, wherein the photoelectric conversion module further comprises a photoelectric conversion device not connected to the selected photoelectric conversion devices, wherein the photoelectric conversion device has a substantially equivalent electrical characteristic of the selected photoelectric conversion devices, and wherein the photoelectric conversion device is used as a spare in the case that one of the selected photoelectric conversion devices becomes defective.

10. The manufacturing method of the photoelectric conversion module according to claim 7, wherein the intrinsic semiconductor layer is formed of amorphous silicon.

11. The manufacturing method of the photoelectric conversion module according to claim 7, wherein each of the first electrodes comprises a light-transmitting conductive film.

12. The manufacturing method of the photoelectric conversion module according to claim 7, wherein the pair of electrodes of the photoelectric conversion module is in direct contact with the substrate through the first electrodes, the island-shaped semiconductor layers, and the second electrodes.

13. A manufacturing method of a photoelectric conversion module, comprising the steps of:
forming a first conductive film over a substrate;
forming a first separation groove in the first conductive film, thereby forming first electrodes;
laminating a semiconductor layer with one conductivity type, an intrinsic semiconductor layer, and a semiconductor layer with a conductivity type opposite the one conductivity type, over the first electrodes and the first separation groove;
forming a second separation groove in the laminated semiconductor layers, thereby forming island-shaped semiconductor layers;
forming a second conductive film so as to cover the island-shaped semiconductor layers and the second separation groove;
forming a third separation groove in the second conductive film to form second electrodes, thereby forming n number of photoelectric conversion devices with an integrated structure containing the first electrodes, the island-shaped semiconductor layers comprising the intrinsic semiconductor layer, and the second electrodes, wherein n is a natural number;
obtaining electrical characteristics of the n number of photoelectric conversion devices;
determining good products and defective products from the electrical characteristics of the n number of photoelectric conversion devices according to a design specification;
selecting n−1 number or less of photoelectric conversion devices corresponding to the good products;
forming an insulating film to cover the n number of photoelectric conversion devices;
forming a pair of conductive layers over both ends of the n number of photoelectric conversion devices with the insulating film interposed therebetween; and
irradiating the pair of conductive layers with a laser light, whereby a pair of electrodes of the photoelectric conversion module is formed and electrically connected to each of the first electrodes and the second electrodes of the selected photoelectric conversion devices in parallel.

14. The manufacturing method of the photoelectric conversion module according to claim 13, wherein the selected photoelectric conversion devices do not include a short-circuited photoelectric conversion device.

15. The manufacturing method of the photoelectric conversion module according to claim 13,
wherein the photoelectric conversion module further comprises a photoelectric conversion device not connected to the selected photoelectric conversion devices,
wherein the photoelectric conversion device has a substantially equivalent electrical characteristic of the selected photoelectric conversion devices, and
wherein the photoelectric conversion device is used as a spare in the case that one of the selected photoelectric conversion devices becomes defective.

16. The manufacturing method of the photoelectric conversion module according claim 13, wherein the intrinsic semiconductor layer is formed of amorphous silicon.

17. The manufacturing method of the photoelectric conversion module according claim 13, wherein each of the first electrodes comprises a light-transmitting conductive film.

18. The manufacturing method of the photoelectric conversion module according to claim 13, wherein the pair of electrodes of the photoelectric conversion module is in direct contact with the substrate through the first electrodes, the island-shaped semiconductor layers, and the second electrodes.

* * * * *

UNITED STATES PATENT AND TRADEMARK OFFICE
CERTIFICATE OF CORRECTION

PATENT NO.       : 9,214,587 B2
APPLICATION NO.  : 13/212395
DATED            : December 15, 2015
INVENTOR(S)      : Kazuo Nishi et al.

It is certified that error appears in the above-identified patent and that said Letters Patent is hereby corrected as shown below:

In the Specification:

Column 13, Line 19; Change "By tuning" to --By turning--.

In the Claims:

Column 14, Line 28, Claim 5; Change "according Claim 1," to --according to Claim 1,--.
Column 16, Line 35, Claim 16; Change "according Claim 13," to --according to Claim 13,--.
Column 16, Line 38, Claim 17; Change "according Claim 13," to --according to Claim 13,--.

Signed and Sealed this
Tenth Day of May, 2016

Michelle K. Lee
*Director of the United States Patent and Trademark Office*